United States Patent [19]

Ogita

[11] 4,293,736

[45] Oct. 6, 1981

[54] NOISE ELIMINATOR FOR RADIO RECEIVER

[76] Inventor: Minoru Ogita, c/o Nippon Gakki Seizo Kabushiki Kaisha, No. 10-1, Nakazawa-cho, Hamamatsu-shi, Shizuoka-ken, Japan

[21] Appl. No.: 84,752

[22] Filed: Oct. 15, 1979

[30] Foreign Application Priority Data

Oct. 20, 1978 [JP] Japan .................. 53-144171[U]

[51] Int. Cl.³ ........................................... H04H 5/00
[52] U.S. Cl. ............................... 179/1 GD; 455/223
[58] Field of Search ................. 179/1 GD, 1 GB; 455/222, 223, 224

[56] References Cited

U.S. PATENT DOCUMENTS

| | | | |
|---|---|---|---|
| 3,626,294 | 12/1971 | Dancy | 455/222 |
| 4,006,419 | 2/1977 | Liman | 455/222 |
| 4,044,309 | 8/1977 | Smith | 455/224 |
| 4,154,980 | 5/1979 | Schmidt et al. | 179/1 GD |

Primary Examiner—Douglas W. Olms
Attorney, Agent, or Firm—Darby & Darby

[57] ABSTRACT

A noise eliminator for a radio receiver comprises an automatic gain control amplifier for amplifying a noise signal extracted from an intermediate-frequency signal or a detector output signal of the receiver, a circuit for producing a faithfully pulsating noise signal and an average noise signal from the output of the amplifier circuit, an operational circuit for detecting an impulse noise component through a comparative operation of the pulsating noise signal and the average noise signal, and a gate circuit for controlling a signal transmission in the receiver in accordance with the detected impulse noise component.

12 Claims, 6 Drawing Figures

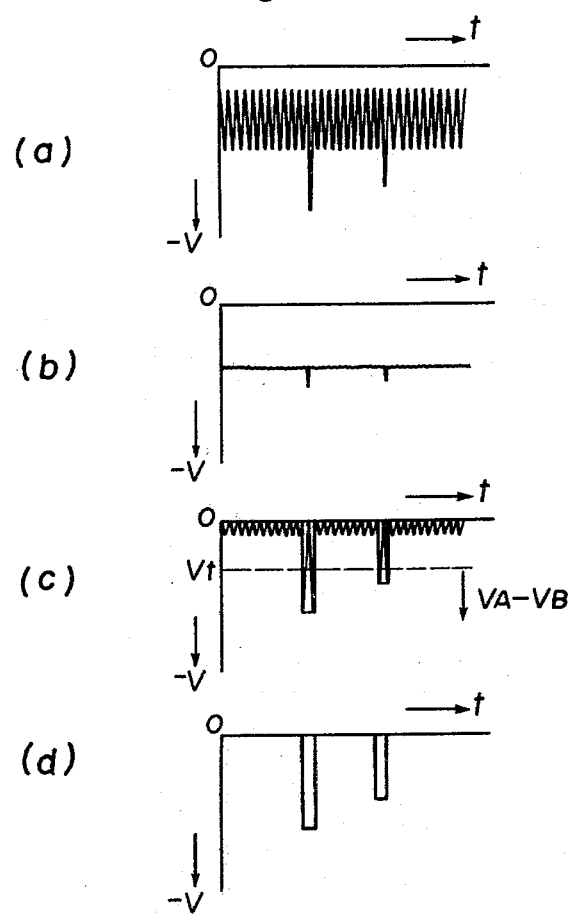

NOISE ELIMINATOR FOR RADIO RECEIVER

BACKGROUND OF THE INVENTION

1. Field of the Invention

The present invention relates principally to a noise eliminator for a radio receiver, and more particularly to an improvement capable of achieving effective elimination of an impulse noise such as an ignition noise from an internal combustion engine.

2. Description of the Prior Art

In advance of an explanation on the noise eliminator of the present invention, a conventional device of this kind will be described briefly.

FIG. 1 shows a block diagram of a known noise eliminator which comprises a noise detection circuit 3 for detecting an impulse noise signal which arrives from an FM detector 2 in an FM receiver, a control-pulse forming circuit 4 for producing a control pulse signal out of the noise signal detected by the circuit 3, and gate circuits 5 for controlling the signal paths at outputs of a multiplex demodulator 12 by the control pulse signal obtained from the circuit 4. In this network, an FM noise is detected by introducing the FM detection output into a 100 KHz high-pass filter 6 and a rectifier 7. The noise signal thus detected is amplified by an amplifier 8 and then is fed to a monostable multivibrator 9 in the control-pulse forming circuit 4 so as to trigger the multivibrator 9. After being integrated by a unidirectional integrator 10, the output of the multivibrator 9 is shaped into a desired waveform by a waveform shaper, e.g. a Schmitt trigger circuit 11 to become a control pulse signal, which is then fed to the gate circuits 5. In response to arrival of the control pulse signal, the gate circuits 5 serve to interrupt the output signal paths of the multiplex stereo demodulator 12 to prevent the noise from appearing in the demodulated output signals.

In such a noise eliminator as described above, however, there exists difficulty in properly setting the absolute triggering level for the monostable circuit 9 due to the variety of the noise component level which varies in accordance with the antenna input level. If the triggering level is relatively low, the gate circuits are frequently rendered nonconductive and the transmission of the demodulator output signals is unnecessarily interrupted resulting in poor efficiency of the signal transmission. On the contrary, when the triggering level is relatively high, the impulse noise will not be eliminated effectively.

SUMMARY OF THE INVENTION

In view of the above-mentioned circumstances regarding the conventional noise eliminator, the present invention has been accomplished in an attempt to provide an improved circuit which is capable of achieving effective elimination of impulse noises in a radio receiver with a simplified circuit configuration and a reduced production cost. The features of the invention reside in the provision of a filter circuit for extracting a noise signal, a circuit for producing a pulsating noise signal and an average noise signal from the filter output, an operational circuit for detecting an impulse noise component through a comparative operation of the pulsating and average noise signals, and a gate circuit for controlling a signal transmission in the receiver in accordance with the detected impulse noise component obtained from the operational circuit.

In a preferred embodiment of this invention, a hold circuit is provided at the output side of the gate circuit to hold an audio signal during the conductive state of the gate circuit.

In the noise eliminator of the invention, any impulsive noise component above the average noise level or a predetermined threshold level is extracted for controlling the receiver signal path, so that the impulsive noise is always eliminatable with accuracy regardless of the antenna input level.

Accordingly, it is an object of the present invention to provide an improved noise eliminator for use in a radio receiver capable of effectively eliminating impulse noise signals regardless of the level of an antenna input signal.

Another object of the invention resides in providing a noise eliminator which is simple in circuit configuration and low in manufacturing cost.

Further objects of the invention and advantageous features thereof will be apparent to those skilled in the art from the following description of a preferred embodiment.

BRIEF DESCRIPTION OF THE DRAWINGS

Hereinafter the present invention will be described in detail with reference to the accompanying drawings illustrating an embodiment thereof.

FIG. 3 (a), (b), (c) and (d) illustrate waveforms useful to explain the operation of the circuit in FIG. 2.

DETAILED DESCRIPTION OF PREFERRED EMBODIMENT

Figure 1:
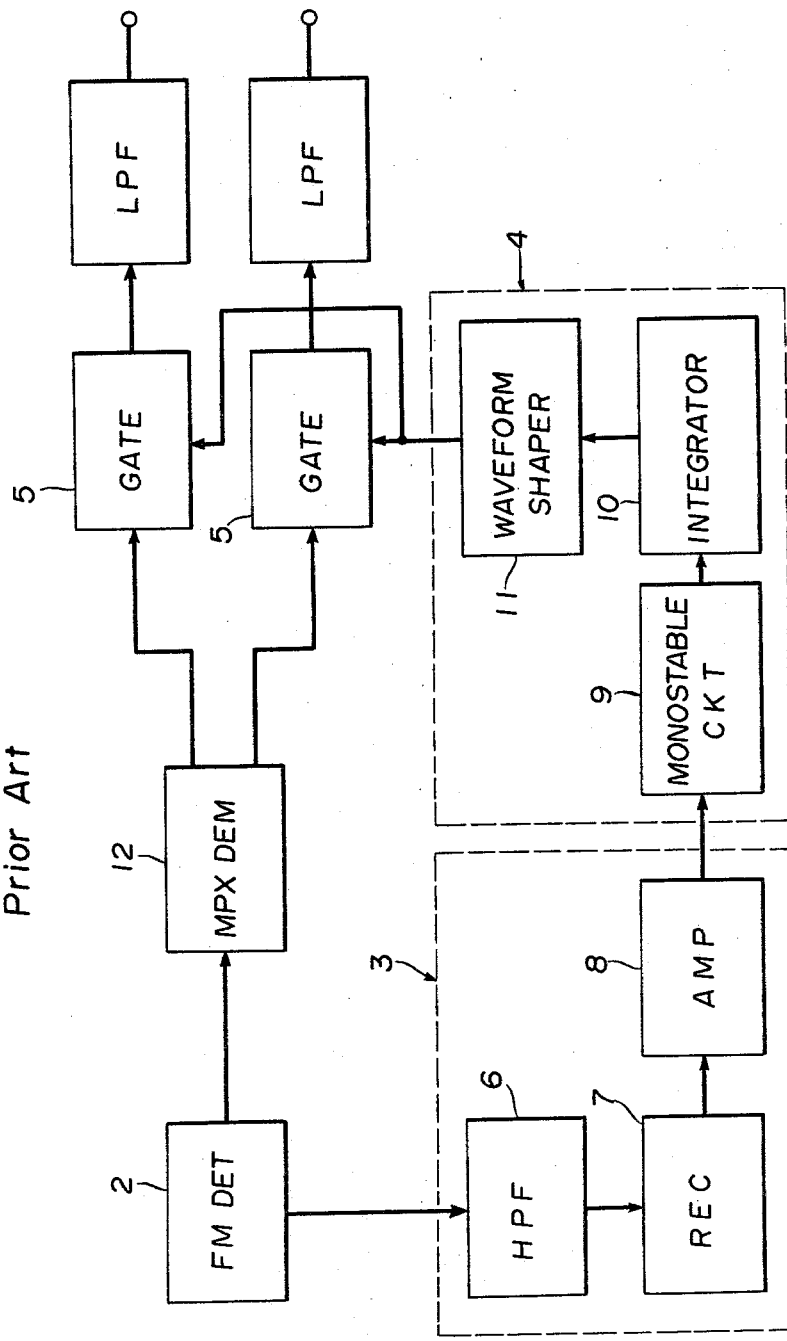
FIG. 1 is a block diagram showing a typical example of a conventional noise eliminator.
Figure 2:
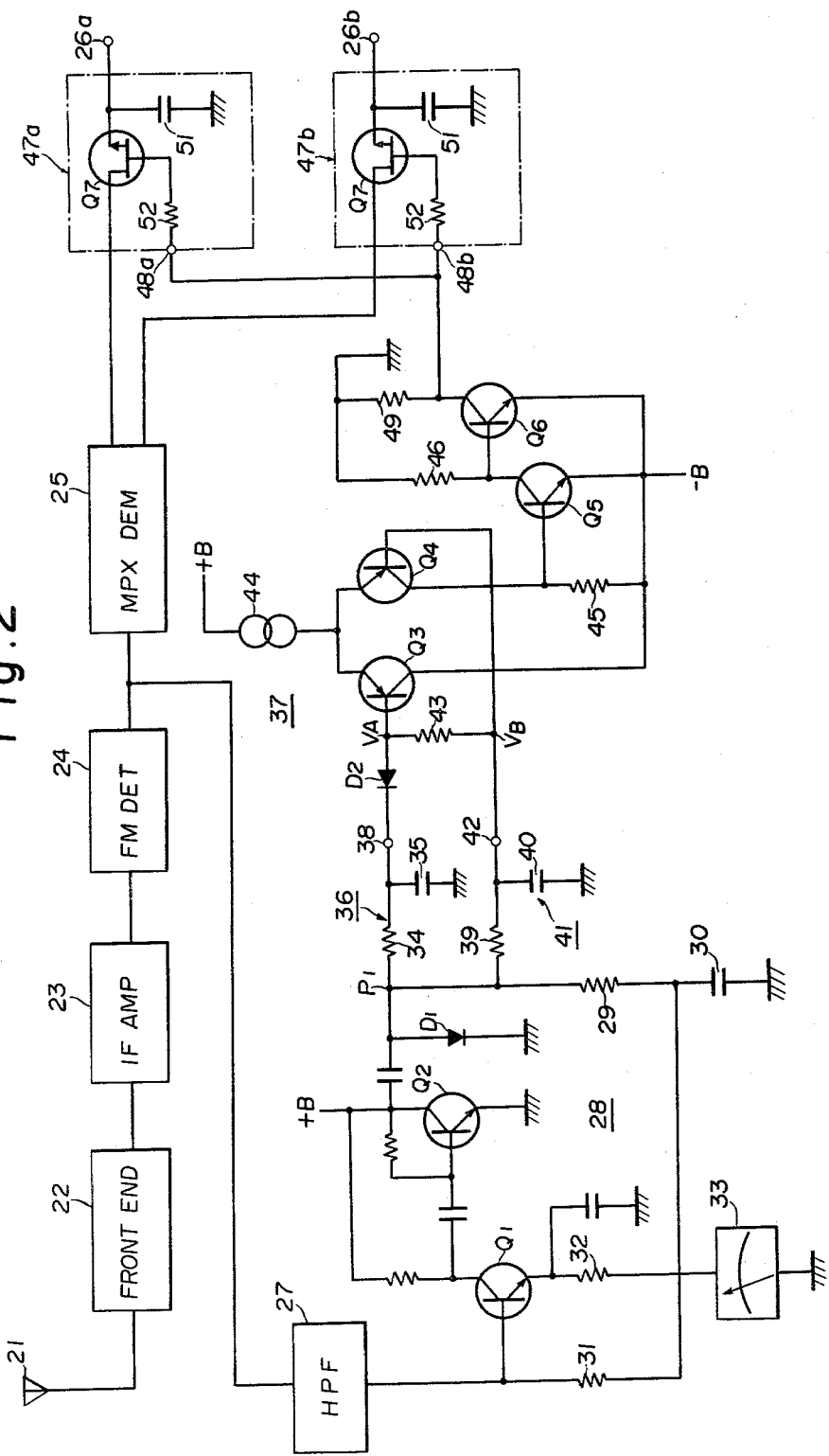
FIG. 2 is a circuit diagram of an example of a noise eliminator according to the invention applied to an FM radio receiver.

Referring to FIG. 2, an input signal received at an antenna 21 is high-frequency amplified and is further converted into an intermediate-frequency (IF) signal in a front end 22, which is subsequently amplified in an IF amplifier 23. The signal therefrom is FM detected in an FM detector 24, whose output is then fed to a multiplex stereo demodulator 25 where demodulated outputs of left and right channels are provided. In the meanwhile, the FM detection output obtained at the output terminal of the FM detector 24 is fed via a high-pass filter 27 to the base of a transistor Q1 in an automatic gain control (AGC) amplifier circuit 28. The high-pass filter 27 has, for example, a critical frequency of 100 KHz.

In the amplifier circuit 28, the signal received from the high-pass filter 27 is amplified by transistors Q1 and Q2, whose output is rectified by a diode D1 shunting the positive portions of the output and then is smoothed by a resistor 29 and a capacitor 30 to produce a smoothed output, which is fed back via a resistor 31 to the base of the transistor Q1. Thus, the rectified output of the diode D1 appearing at a junction point P1 is subjected to automatic gain control in which the gain of the amplifier circuit 28 is controlled to be small when the output of the filter 27 increases. In this circuit configuration, a current meter 33 is connected to an emitter resistor 32 located on the emitter side of the transistor Q1 so that the meter 33 indicates the noise intensity which is inversely proportional to an emitter current of the transistor Q1. The junction point P1 is connected to an input terminal 38 of an operational circuit 37 via an integrator 36 consisting of a resistor 34 and a capacitor 35, and is also connected to another input terminal 42 of the operational circuit 37 via an integrator 41 consisting of a resistor 39 and a capacitor 40. The integrator 41 has a time constant much greater than that of the integrator 36 so that the integrator 41 produces an average signal of the noise signal appearing at point P1 while the integrator 36 produces a pulsating signal which is more faithful in wave shape to the above-said noise signal than said average signal is.

The operational circuit 37 executes, at a predetermined threshold level, comparative operation of the signals obtained at the input terminals 38 and 42, wherein the terminal 38 is connected to the base of a transistor Q3 via a reversely connected diode D2 serving to set the threshold level, while the terminal 42 is connected to the base of a transistor Q4.

The transistors Q3 and Q4 constitute a differential amplifier, and a resistor 43 is connected between the respective bases. A common emitter thereof is connected to a positive power supply +B via a constant-current source 44, and the collector of the transistor Q3 is connected to a negative power supply −B, while the collector of the transistor Q4 is connected to the base of a transistor Q5 in the next stage and also to the negative power supply −B via a load resistor 45. The collector of the transistor Q5 is connected to the base of a transistor Q6 while being grounded via a resistor 46, and the emitter of the transistor Q5 is connected to the negative power supply −B. As for the transistor Q6, the collector thereof is connected to input terminals 48a and 48b of control circuits 47a and 47b while being grounded via a resistor 49, and the emitter thereof is connected to the negative power supply −B. The two transistors Q5 and Q6 constitute a circuit to produce a negative control pulse signal from the output of the operational circuit 37. Each of the control circuits 47a and 47b consists of a field-effect transistor Q7 which is connected in series with the output signal path of the demodulator 25, and a capacitor 51 inserted at the output side of the field effect transistor between the signal path and the ground, wherein the control pulse signal is applied to the gate of the field-effect transistor Q7 via a resistor 52. The respective control circuits 47a and 47b deliver output signals to output terminals 26a and 26b of the receiver.

In the network of the above configuration, impulse noise elimination is performed as follows. First the FM detection output of the FM detector 24 is introduced to the high-pass filter 27, from the noise component is selectively obtained and then is fed to the AGC amplifier 28, where the noise component is amplified with automatic gain control. In this case, the meter 33 is driven by the emitter current of the transistor Q1 varying in accordance with the noise component. The noise signal amplified and rectified by the AGC amplifier circuit 28 is obtained at the junction point P1 and is fed to the integrators 36 and 41. The integrator 36 produces a pulsating noise signal as shown in FIG. 3 (a) from the noise signal at the junction point P1 and feeds the same to one input terminal 38 of the operational circuit 37. In the meanwhile, the integrator 41 produces an average noise signal shown in FIG. 3 (b) from the noise signal at the junction point P1 and feeds the same to the other input terminal 42 of the operational circuit 37. Accordingly, voltage signals VA and VB appear across the resistor 43 wherein the signal VA is the pulsating noise signal beyond the threshold level Vt, i.e. about 0.6 volt in absolute value determined by the diode D2 and the signal VB is the average noise signal. In other words, at the output of the differential amplifier is obtained a difference signal between the pulsating noise signal and the average noise signal and beyond the threshold level as shown in FIG. 3 (c), so that an impulse noise signal is effectively extracted through the comparative operation between the relatively faithful noise signal and the average noise signal. The impulse noise signal thus extracted is a noise signal beyond the average noise signal level and the threshold level.

It is to be noted here that the integrator 36 may be spared, though it acts to make the phase of the pulsating noise signal exactly coincide with that of the average noise signal obtained through the integrator 41. The diode D2 may also be spared but is preferably provided to set the threshold level so that the noise eliminator does not respond to small negligible impulse noises.

The extracted impulse noise signal is amplified by the transistors Q5 and Q6, and the control pulse signal shown in FIG. 3 (d) obtained from the collector of the transistor Q6 is applied to the gate of the field-effect transistor Q7 in the control circuits 47a and 47b. In response to arrival of the control pulse signal, each field-effect transistor Q7 is rendered nonconductive to interrupt the output signal path 50 of the demodulator 25 thus preventing an impulse noise from being reproduced. This signal interruption does not cause any serious problem to the reproduced sound since the signal having been held in the capacitor 51 is supplied to the receiver output during such interruption.

The input to the high-pass filter 27 in the above embodiment may be an intermediate-frequency signal obtained from the IF amplifier 23, instead of the FM detection output fed via the high-pass filter 27. This is true especially when the invention is applied to an AM radio receiver.

What is claimed is:
1. A noise eliminator for a radio receiver, comprising:
first circuit means coupled to a signal path leading from a front end circuit to a demodulator circuit in the receiver and including a filter circuit for deriving a noise signal contained in a signal on said signal path;
second circuit means receiving said noise signal for averaging the same to produce an average signal;
third circuit means for producing a differential signal corresponding to a difference between said noise signal and said average signal;
gating means inserted between said demodulator circuit and an output terminal of the receiver for interrupting a transmission of a demodulated output signal to said output terminal when said gating means is nonconductive; and
fourth circuit means responsive to said differential signal for rendering said gating means nonconductive.
2. The noise eliminator according to claim 1, in which said third circuit means includes threshold means for setting a threshold level so that said third circuit means delivers out said differential signal which exceeds said threshold level.
3. The noise eliminator according to claim 1, in which said second circuit means comprises a first integrating circuit and a second integrating circuit having a greater time constant than that of the first integrating circuit so that said second integrating circuit produces said average signal and said first integrating circuit produces a pulsating signal which is more faithful in wave shape to said noise signal than said average signal is.

4. The noise eliminator according to claim 3, in which said third circuit means comprises a differential amplifier having a pair of inputs connected respectively to outputs of said first and second integrating circuits, and a resistance element interconnecting said pair of inputs of the differential amplifier.

5. The noise eliminator according to claim 4, in which said third circuit means further comprises threshold means connected between the output of either of said first and second integrating circuits and the corresponding input of said differential amplifier for establishing a threshold level so that the third circuit means produces said differential signal exceeding the threshold level.

6. The noise eliminator according to claim 5, in which said threshold means comprises a diode connected between the output of said first integrating circuit and the input of said differential amplifier.

7. The noise eliminator according to one of claims 1 through 6, in which said first circuit means further comprises a gain-controlled amplifier connected to an output of said filter circuit, and gain controlling means for controlling the gain-controlled amplifier in accordance with an output signal of said gain-controlled amplifier.

8. The noise eliminator according to claim 7, in which said gain controlling means comprises a negative feedback circuit including a rectifier connected to an output of said gain-controlled amplifier and a feedback path leading from said output to an input both of said gain-controlled amplifier.

9. The noise eliminator according to claim 4, in which said fourth circuit means comprising an amplifier for amplifying an output signal of said differential amplifier to produce a control signal suited for actuating said gating means.

10. The noise eliminator according to one of claims 1 through 6, further comprising a hold circuit connected parallel to a signal path leading from said gating means to said receiver output terminal.

11. The noise eliminator according to claim 1, in which said filter circuit comprises a high-pass filter having a critical frequency of 100 KHz.

12. The noise eliminator according to claim 1, in which said receiver is an FM receiver and said demodulator is a multiplex demodulator, the receiver comprising an intermediate frequency amplifier connected to an output of said front end circuit and an FM detector connected to an output of said intermediate amplifier and followed by said multiplex demodulator, and in which said first circuit means is connected to an output of said FM detector and said filter circuit is a high-pass filter.

* * * * *